(12) United States Patent
Kuroki et al.

(10) Patent No.: US 8,013,645 B2
(45) Date of Patent: Sep. 6, 2011

(54) DLL CIRCUIT ADAPTED TO SEMICONDUCTOR DEVICE

(75) Inventors: Koji Kuroki, Chuo-ku (JP); Ryuuji Takishita, Fukuoka (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 12/465,355

(22) Filed: May 13, 2009

(65) Prior Publication Data

US 2009/0284290 A1 Nov. 19, 2009

(30) Foreign Application Priority Data

May 16, 2008 (JP) ................................. 2008-129638

(51) Int. Cl.
*H03L 7/06* (2006.01)
(52) U.S. Cl. ......................................... 327/158; 327/149
(58) Field of Classification Search .................. 327/149, 327/158
See application file for complete search history.

(56) References Cited

U.S. PATENT DOCUMENTS

| | | | | |
|---|---|---|---|---|
| 6,452,432 B2 * | 9/2002 | Kim | ............................. | 327/158 |
| 7,375,565 B2 * | 5/2008 | Kwak | ........................... | 327/158 |
| 7,388,415 B2 * | 6/2008 | Lee | ............................... | 327/158 |
| 7,428,284 B2 * | 9/2008 | Lin | ............................... | 375/355 |
| 7,457,392 B2 * | 11/2008 | Weis et al. | ..................... | 375/376 |
| 7,482,850 B2 * | 1/2009 | Kawamoto | .................... | 327/158 |
| 7,495,486 B2 * | 2/2009 | Lee | ............................... | 327/158 |
| 7,649,389 B2 * | 1/2010 | Bae | .............................. | 327/158 |
| 7,701,272 B2 * | 4/2010 | Ma | ................................ | 327/158 |
| 7,728,638 B2 * | 6/2010 | Varricchione | ................. | 327/158 |
| 7,733,140 B2 * | 6/2010 | Kwak | ........................... | 327/158 |
| 2007/0085580 A1 * | 4/2007 | Singh et al. | .................... | 327/158 |
| 2008/0211555 A1 * | 9/2008 | Kwak | ........................... | 327/158 |
| 2008/0297215 A1 * | 12/2008 | Ma | ................................ | 327/158 |
| 2009/0134924 A1 * | 5/2009 | Kawamoto | .................... | 327/158 |
| 2009/0167387 A1 * | 7/2009 | Kim | ............................. | 327/157 |
| 2010/0171536 A1 * | 7/2010 | Chen | ............................ | 327/158 |

FOREIGN PATENT DOCUMENTS

JP 2002-42469 A 2/2002

* cited by examiner

*Primary Examiner* — Lincoln Donovan
*Assistant Examiner* — Adam D Houston
(74) *Attorney, Agent, or Firm* — Sughrue Mion, PLLC

(57) ABSTRACT

A DLL circuit is designed to adjust the delay time and the duty applied to an input clock signal, thus producing a DLL clock signal. In a non-clocking state of the DLL clock signal in which pulses disappear temporarily, the DLL circuit stops updating the delay time and the duty of the DLL clock signal. That is, the DLL circuit is capable of preventing a phase difference between the input clock signal and the DLL clock signal from being erroneously detected in the non-clocking state of the DLL clock signal, thus preventing the delay time and the duty from being updated based on the erroneously detected phase difference. Thus, it is possible to reduce the number of cycles adapted to the delay-locked control and to thereby stabilize the operation of the DLL circuit.

13 Claims, 9 Drawing Sheets

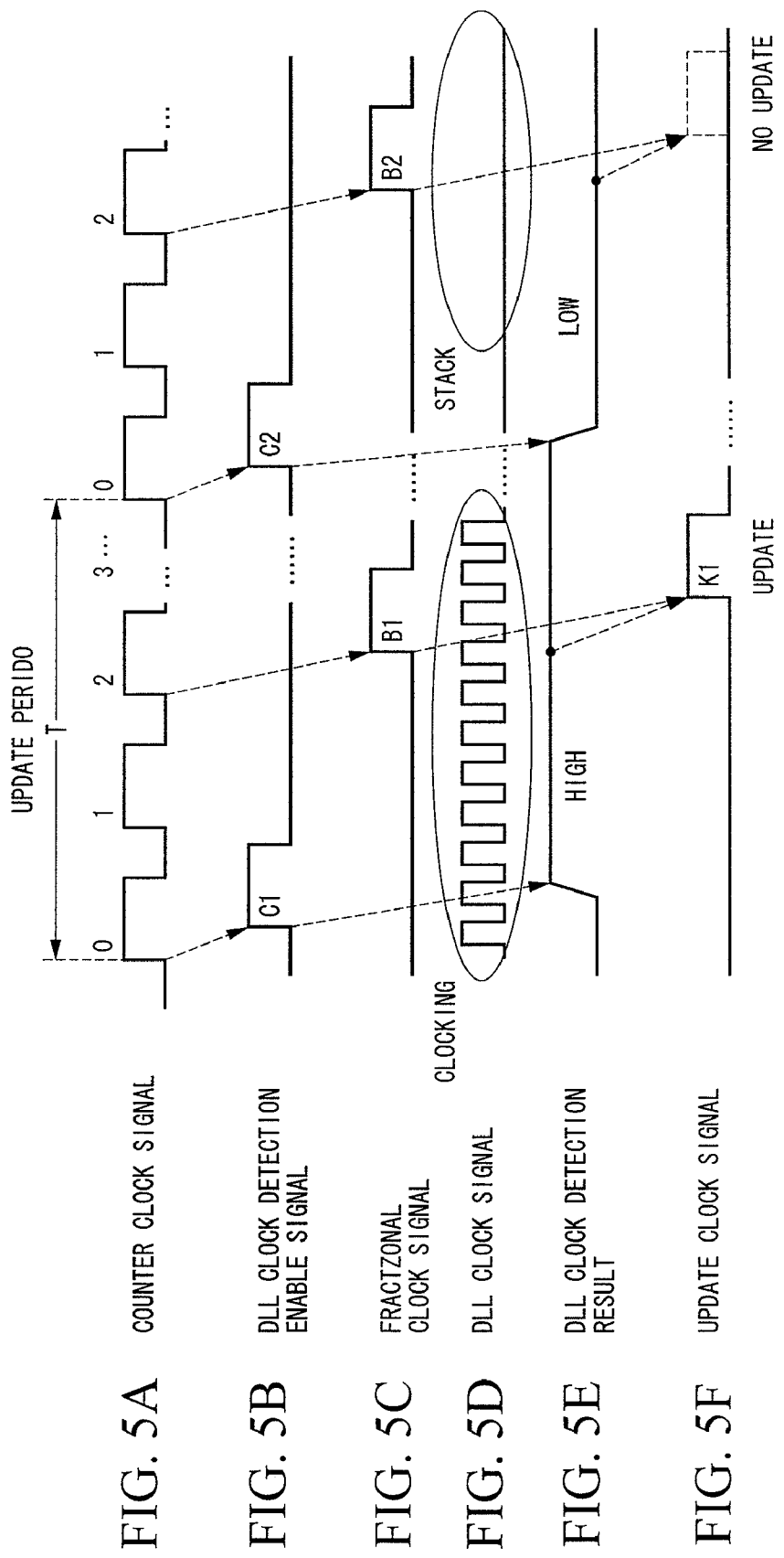

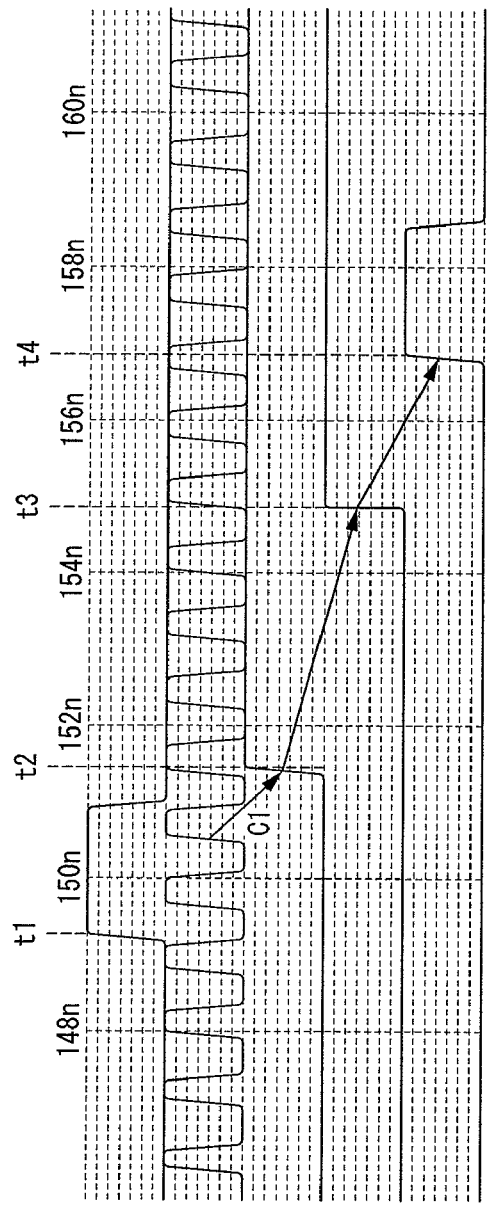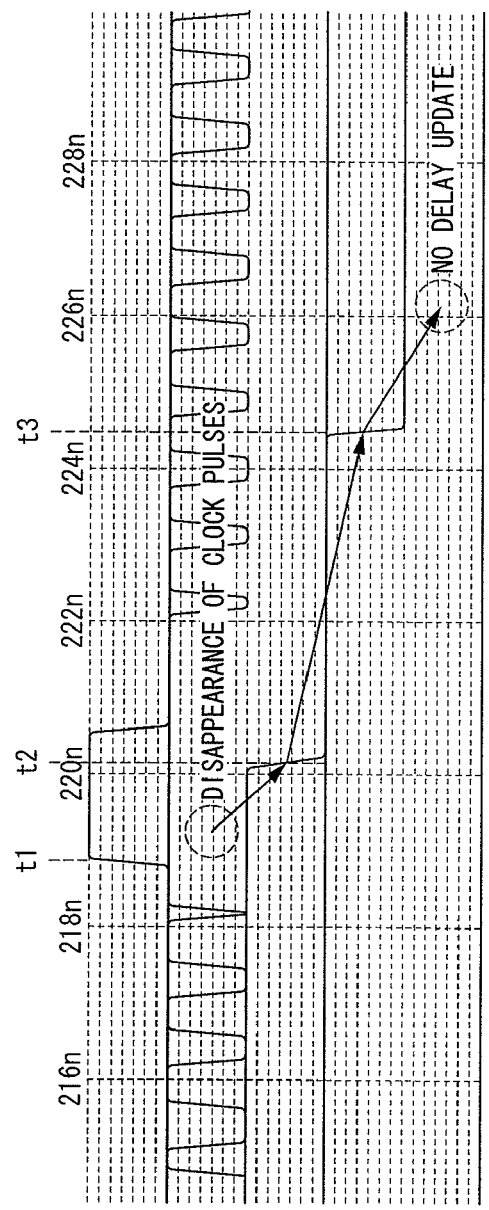

DLL CIRCUIT ADAPTED TO SEMICONDUCTOR DEVICE

BACKGROUND OF THE INVENTION

1. Field of the Invention

The present invention relates to delay-locked loop (DLL) circuits adapted to semiconductor devices.

The present application claims priority on Japanese Patent Application No. 2008-129638, the content of which is incorporated herein by reference.

2. Description of the Related Art

Due to increasing high-speed processing of electronic systems recently developed, it is necessary to perform high-speed data transfer between semiconductor devices installed in electronic systems, wherein semiconductor devices employ clock synchronization methods. As semiconductor memory devices, synchronous dynamic random-access memories (SDRAM) have been conventionally used and further developed into double-data-rate (DDR) SDRAM, DDR2 SDRAM, and DDR3 SDRAM which operate in synchronization with leading/trailing edges of clock pulses.

In order to establish synchronization with clock pulses, delay-locked loop (DLL) circuits have been used for synchronous dynamic random-access memories (SDRAM) so as to establish synchronization of timing between internal clock pulses and external clock pulses.

FIG. 9 shows an example of a DLL circuit in which a clock signal CK and an inverse clock signal /CK (where a slash or bar "/" indicates logical inversion) from an external device (not shown) are supplied to an initial circuit 11 and are then subjected to duty adjustment and delay adjustment, thus producing a DLL clock signal.

Along a path A shown by dotted lines, the DLL clock signal is supplied to a DQ replica circuit 15, from which a DQ replica output signal is supplied to a phase detection circuit 16 and subjected to phase comparison with the clock signal CK and the inverse clock signal /CK. The phase comparison result is fed back to a delay control circuit 13. Based on the phase comparison result output from the phase detection circuit 16, the delay control circuit 13 outputs a delay signal to a delay circuit 12 so as to adjust a delay element of the delay circuit 12.

Along a path B shown by dotted lines, the DLL clock signal is supplied to a duty detection circuit 21 and subjected to detection as to whether a duty thereof is above or below 50%. The duty detection result is fed back to a duty control circuit 22. Based on the duty detection result output from the duty detection circuit 21, the duty control circuit 22 outputs a control signal (i.e. a duty signal) to a duty adjustment circuit 23. The duty adjustment circuit 23 adjusts the duty of a clock signal output from the initial circuit 11 based on the clock signal CK and the inverse clock signal /CK in accordance with the duty signal output from the duty control circuit 22.

The delay circuit 12 performs delay adjustment so as to cancel out timing skew between the DQ replica output signal and the clock signal CK (or the inverse clock signal /CK). In addition, the duty adjustment circuit 23 performs duty adjustment such that the duty of the DLL clock signal becomes equal to or close to 50%.

The clock signal output from the initial circuit 11 is subjected to a frequency dividing process by a counter clock generation circuit 17, which thus outputs a counter clock signal to a DLL cycle counter 18. Based on the counter clock signal, the DLL cycle counter 18 generates an update clock signal for a prescribed duration, thus outputting it to the delay control circuit 13 and the duty control circuit 22. The delay control circuit 13 and the duty control circuit 22 update their operations in response to the update clock signal.

It is necessary for the DLL circuit of FIG. 9 to perform a delay-locked control for establishing synchronization between the internal clock signal and the external clock signal by way of a delay adjustment and duty adjustment with a small number of cycles during a DLL reset period; hence, it is necessary to simultaneously perform the delay adjustment and the duty adjustment. At a high input clock frequency, each pulse width of the input clock signal varies greatly due to delay adjustment during the locked-control operation, thus causing the DLL clock signal to disappear temporarily.

Since the phase detection circuit 16 and the duty detection circuit 21 trigger their operations in response to the DLL clock signal, it is very difficult to precisely detect the phase in the period in which the DLL clock signal disappears.

Repeating the phase detection and the duty detection in erroneous manners increases the number of cycles adapted to the delay-locked control and disables the delay-clocked control pursuant to prescribed technical specifications which are determined in advance. This requires manufacturers to solve the above problem due to the temporary disappearance of the DLL clock signal.

Various technologies for canceling out deviations of duties of clock signals have been developed and disclosed in various documents such as Patent Document 1.

Patent Document 1: Japanese Unexamined Patent Application Publication No. 2002-42469

Patent Document 1 teaches a clock generation circuit which cancels out deviations of the duty of an output clock signal (causing some problems in phase control) by additionally using a simple circuit, thus achieving high-precision phase control. Specifically, a variable delay circuit is followed by a clock duty adjustment circuit and is controlled in the delay time thereof at the leading edge of a clock pulse, wherein the clock duty adjustment circuit performs adjustment at the trailing edge when the phase of the output clock signal at its leading edge matches the phase of a reference clock signal, thus identifying the duty of the output clock signal with the duty of the reference clock signal.

The present inventors have recognized that the clock generation circuit of Patent Document 1 is not designed to solve the above problem regarding the delay-locked control in which the DLL circuit fails to precisely perform phase adjustment due to erroneous detection during the disappearance period of the DLL clock signal, thus increasing the number of cycles adapted to the delay-locked control.

Due to the execution of the delay-locked control with a small number of cycles during the DLL reset period, it is necessary for the DLL circuit to simultaneously perform the delay adjustment and the duty adjustment. At a high input clock frequency, each pulse width of the input clock signal varies greatly due to delay adjustment during the delay-locked control so as to cause the disappearance period of the DLL clock signal, which makes it very difficult to precisely perform the phase detection and the duty detection.

In addition, repeating the phase detection and the duty detection in erroneous manners increases the number of cycles adapted to the delay-locked control and disables the delay-locked control pursuant to prescribed technical specifications.

SUMMARY

The invention seeks to solve the above problem, or to improve upon the problem at least in part.

The present invention is directed to a DLL circuit which generates and monitors a DLL clock signal based on an input clock signal and which prevents a delay time and a duty from being updated based on the phase detection result and the duty detection result erroneously produced due to disappearance of the DLL clock signal, thus executing the delay-locked control with a small number of cycles in a stable manner.

In one embodiment, a DLL circuit for adjusting the phase of an input clock signal is constituted of delay control circuit for producing a delay signal so as to control a delay time applied to the input clock signal, a delay circuit for applying the delay time to the input clock signal based on the delay signal, thus producing a DLL clock signal, and a DLL clock detection circuit for detecting either a clocking state or a non-clocking state with respect to the DLL clock signal, wherein the DLL clock detection circuit controls the delay control circuit to stop updating the delay time in the delay circuit in the non-clocking state of the DLL clock signal.

In another embodiment, a DLL circuit for adjusting the duty of an input clock signal is constituted of a duty control circuit for producing a duty signal so as to control the duty of the input clock signal, a duty adjustment circuit for adjusting the duty of the input clock signal based on the duty signal, thus producing a DLL clock signal, and a DLL clock detection circuit for detecting either a clocking state or a non-clocking state with respect to the DLL clock signal, wherein the DLL clock detection circuit controls the duty control circuit to stop updating the duty in the duty adjustment circuit in the non-clocking state of the DLL clock signal.

In the above, it is possible to prevent a phase difference between the input clock signal and the DLL clock signal from being erroneously detected in the non-clocking state of the DLL clock signal in which pulses disappear temporarily, thus preventing the delay time and the duty from being updated based on the erroneously detected phase difference. Thus, it is possible to reduce the number of cycles adapted to the delay-locked control and to thereby stabilize the operation of the DLL circuit.

BRIEF DESCRIPTION OF THE DRAWINGS

The above features and advantages of the present invention will be more apparent from the following description of certain preferred embodiments taken in conjunction with the accompanying drawings, in which:

FIG. 5A shows the waveform of a counter clock signal output from a counter clock generation circuit shown in FIGS. 1 to 3;

FIG. 5B shows the waveform of a DLL clock detection enable signal output from a DLL cycle counter shown in FIGS. 1 to 3;

FIG. 5C shows the waveform of a fractional clock signal generated by the DLL cycle counter based on the counter clock signal of FIG. 5A;

FIG. 5D shows the waveform of a DLL clock signal output from a delay circuit shown in FIGS. 1 and 3;

FIG. 5E shows the waveform of a DLL clock detection result produced by a DLL clock detection circuit shown in FIGS. 1 to 3 with respect to the DLL clock signal;

FIG. 5F shows the waveform of an update clock signal output from the DLL cycle counter;

FIG. 6A shows the waveform of the DLL clock detection enable signal in a clocking state of the DLL clock signal;

FIG. 6B shows the waveform of the DLL clock signal in the clocking state;

FIG. 6C shows the waveform of the DLL clock detection result in the clocking state of the DLL clock signal;

FIG. 6D shows the waveform of an update enable/disable signal in the clocking state of the DLL clock signal;

FIG. 6E shows the waveform of the update clock signal in the clocking state of the DLL clock signal;

FIG. 6F shows the waveform of the DLL clock detection enable signal in a non-clocking state of the DLL clock signal;

FIG. 6G shows the waveform of the DLL clock signal in the non-clocking state of the DLL clock signal;

FIG. 6H shows the waveform of the DLL clock detection result in the non-clocking state of the DLL clock signal;

FIG. 6I shows the waveform of the update enable/disable signal in the non-clocking state of the DLL clock signal;

FIG. 6J shows the waveform of the update clock signal in the non-clocking state of the DLL clock signal;

DETAILED DESCRIPTION OF PREFERRED EMBODIMENTS

The present invention will be now described herein with reference to illustrative embodiments. Those skilled in the art will recognize that many alternative embodiments can be accomplished using the teachings of the present invention and that the invention is not limited to the embodiments illustrated for explanatory purposes.

1. First Embodiment

Figure 1:
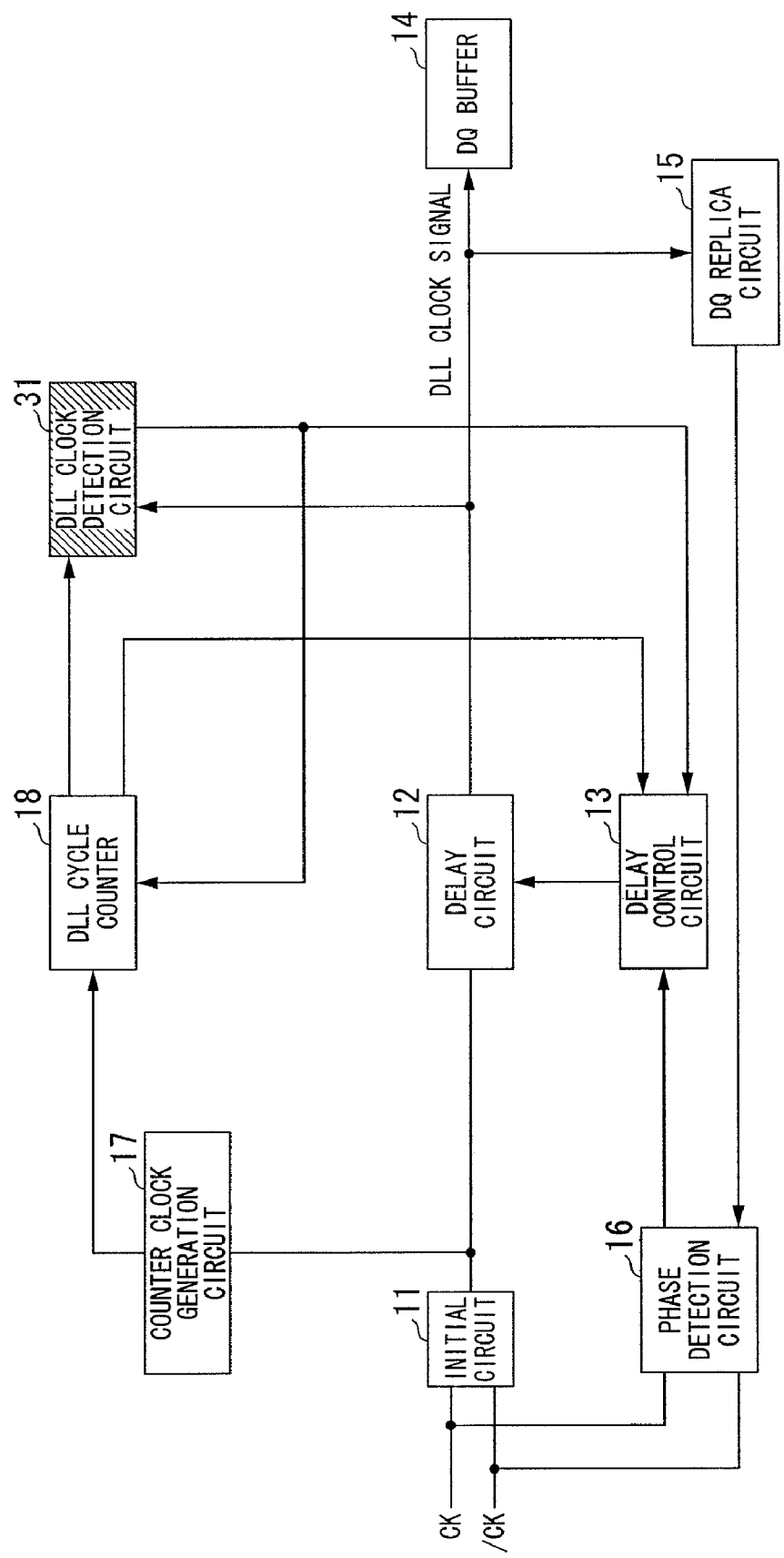
FIG. 1 is a block diagram showing the constitution of a DLL circuit according to a first embodiment of the present invention.
Figure 9:
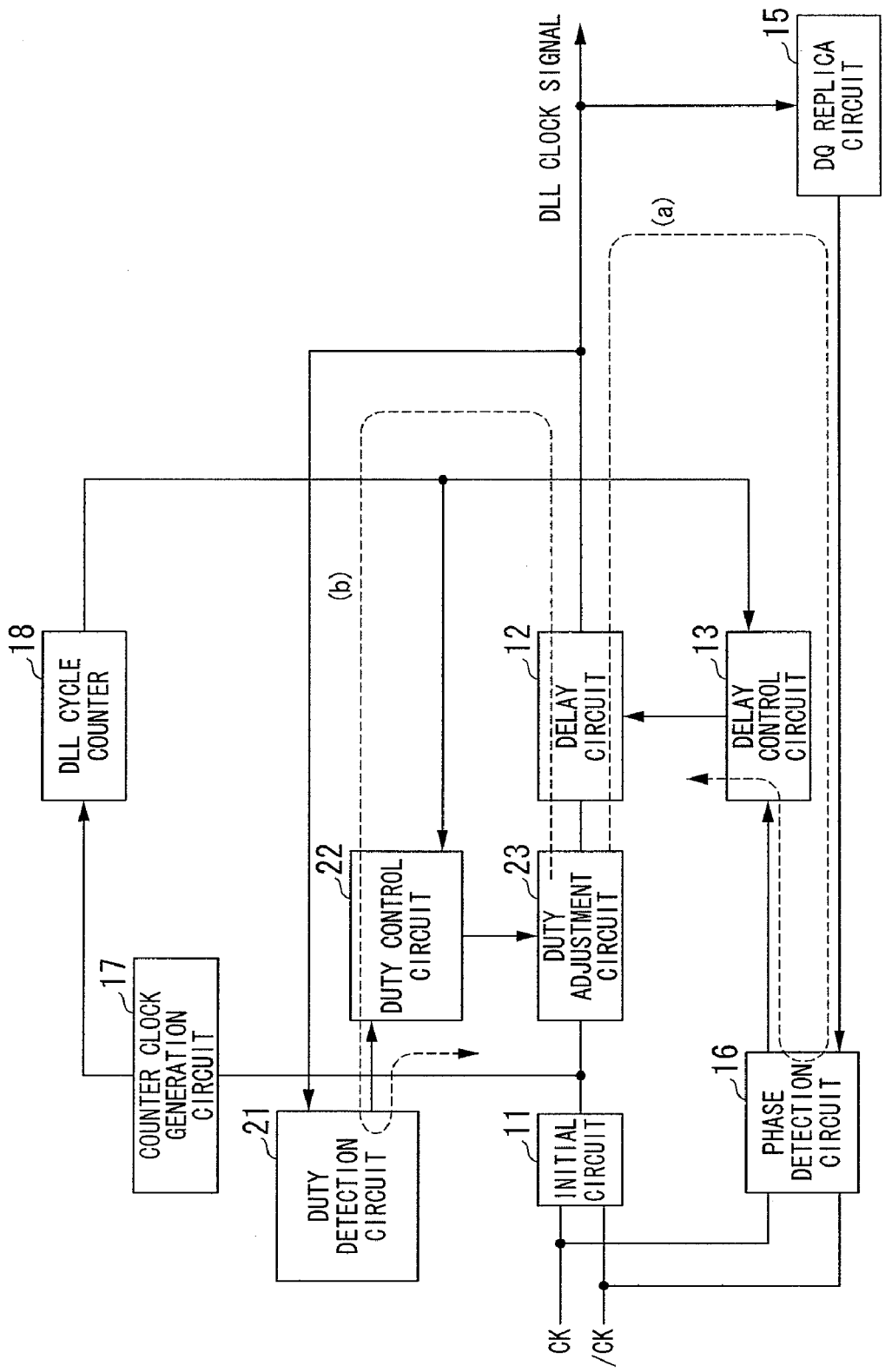
FIG. 9 is a block diagram showing the constitution of the foregoing DLL circuit.

FIG. 1 shows a DLL circuit according to a first embodiment of the present invention, which is designed to perform the phase control only, wherein parts identical to those shown in FIG. 9 are designated by the same reference numerals. The DLL circuit of FIG. 1 includes a DQ buffer 14 whose output signal is synchronized with the clock signal CK and the inverse clock signal /CK by correcting a delay time.

In FIG. 1, the initial circuit 11 receives a differential input signal corresponding to the clock signals CK and /CK, thus producing a clock signal for the DLL circuit. The clock signal output from the initial circuit 11 is supplied to the delay circuit 12 and the counter clock generation circuit 17.

The counter clock generation circuit 17 divides the frequency of the clock signal so as to generate and output a counter clock signal (see FIG. 5A) to the DLL cycle counter 18.

The delay circuit 12 includes a plurality of delay elements, one of which is selected to impart a prescribed delay time to the clock signal in response to a delay signal output from the delay control circuit 13.

The delay control circuit 13 determines the delay time based on the phase detection result output from the phase detection circuit 16, thus outputting the delay signal to the delay circuit 12. The DQ buffer 14 buffers a DLL clock signal output from the delay circuit 12, thus outputting a DQ signal. The DQ replica circuit 15 is a replica (or a replication) of the DQ buffer 14; that is, it is a buffer circuit having the same PVT dependency (i.e. dependency of process, voltage, and temperature) as the DQ buffer 14.

The phase detection circuit 16 performs phase comparison between the DQ replica output signal (output from the DQ replica circuit 15) and the clock signals CK and /CK, thus outputting a phase detection result representing a phase difference between them to the delay control circuit 13. The DLL cycle counter 18 counts the number of pulses included in the counter clock signal so as to generate an update clock signal (see FIG. 5F) for updating the duty/delay control.

The DLL circuit of FIG. 1 additionally includes a DLL clock detection circuit 31, which is activated upon reception of a DLL clock detection enable signal output from the DLL cycle counter 18 and which makes determination as to whether or not the DLL clock signal is disappeared (or whether or not the DLL clock signal is placed in a clocking state), thus executing or stopping the duty/delay control.

In the DLL circuit of FIG. 1, the initial circuit 11 converts the differential input signal (corresponding the clock signals CK and /CK) into the clock signal, which is then output to the delay circuit 12. The delay circuit 12 adjusts the delay time of the clock signal output from the initial circuit 11 in accordance with the delay signal output from the delay control circuit 13, thus outputting the DLL clock signal to the DQ buffer 14.

The DLL clock signal output from the delay circuit 12 is also supplied to the DQ replica circuit 15 which has the same PVT dependency as the DQ buffer 14. Since the DQ replica circuit 15 serves as a buffer circuit having the same PVT dependency as the DQ buffer 14, the DQ replica output signal is output at the same timing as the DQ buffer 14 outputting the DQ output signal. The DQ replica output signal is supplied to the phase detection circuit 16 and subjected to phase comparison with the clock signals CK and /CK. The phase detection result output from the phase detection circuit 16 is supplied to the delay control circuit 13, so that the delay circuit 12 adjusts the delay time based on the delay signal output from the delay control circuit 13.

The DLL clock detection circuit 31 receives the DLL clock detection enable signal (output from the DLL cycle counter 18) and the DLL clock signal (output from the delay circuit 12), wherein the DLL clock detection circuit 31 is periodically activated by the DLL clock detection enable signal. The period of the DLL clock detection enable signal is identical to the update period for updating the delay time.

The DLL clock detection circuit 31 makes determination as to whether or not the DLL clock signal is placed in a clocking state, thus producing and outputting a DLL clock detection result (or update enable/disable signals) to the DLL cycle counter 18 and the delay control circuit 13. The DLL clock detection circuit 31 controls the DLL cycle counter 18 to output or stop the update clock signal, thus executing or stopping updating the delay time by way of the delay circuit 12 and the delay control circuit 13.

The first embodiment is characterized by using the DLL clock detection circuit 31 for determining whether or not the DLL clock signal is placed in a clocking state, wherein the DLL clock determination result is supplied to the DLL cycle counter 18 and the delay control circuit 13 so as to stops updating the delay time in a non-clocking state of the DLL clock signal. In the delay-locked control of the DLL circuit of the first embodiment, it is possible to prevent the delay time from being updated based on the phase detection result which is erroneously produced in the disappearance period of the DLL clock signal. Thus, it is possible to reduce the number of clock pulses adapted to the delay-locked control and to thereby improve the stability of the DLL circuit performing the delay-locked control.

The DLL circuit of FIG. 1 is designed to periodically activate the DLL clock detection circuit 31 in response to the DLL clock detection enable signal output from the DLL cycle counter 18. It can be redesigned to normally activate the DLL clock detection circuit 31.

2. Second Embodiment

Figure 2:
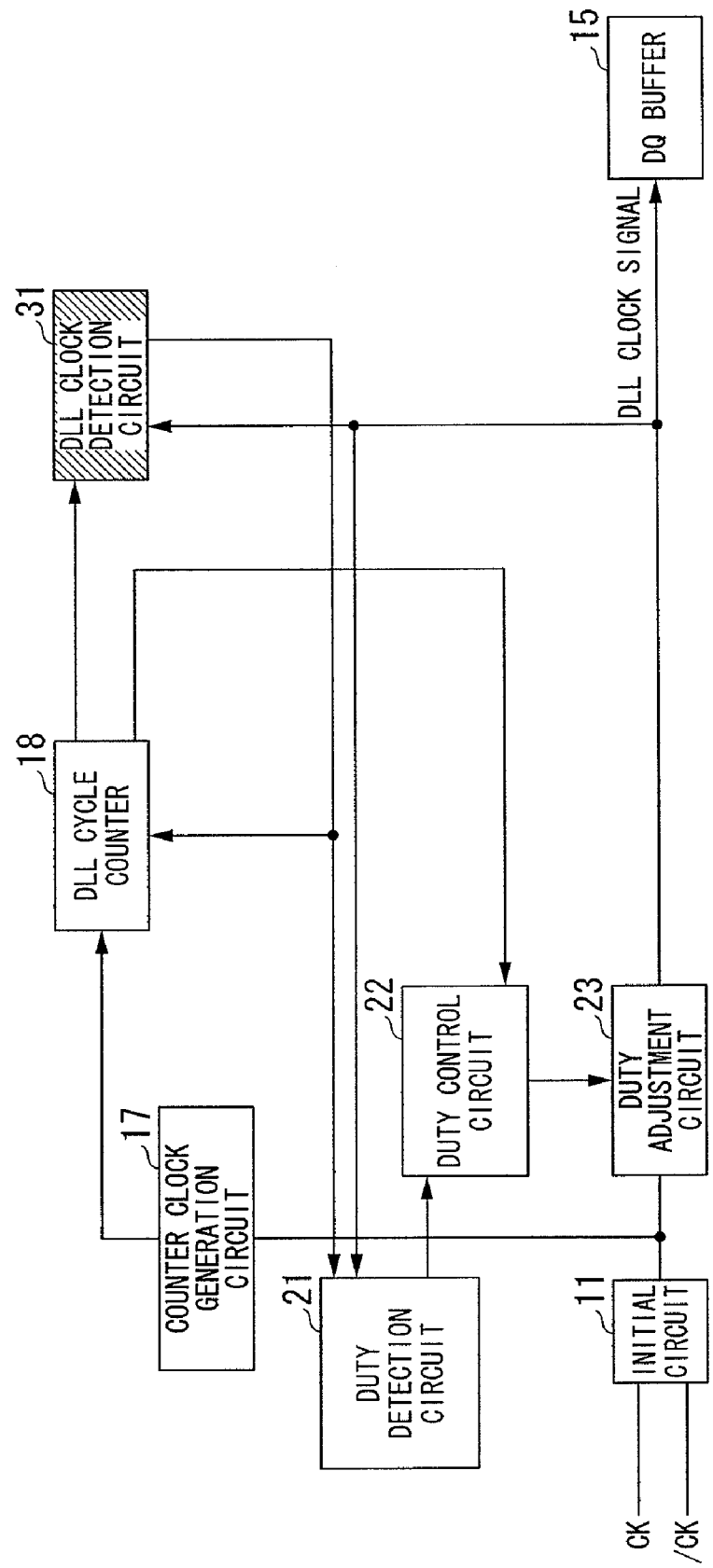
FIG. 2 is a block diagram showing the constitution of a DLL circuit according to a second embodiment of the present invention.

FIG. 2 shows a DLL circuit according to a second embodiment of the present invention, which is designed to perform the duty control only, wherein parts identical to those shown in FIGS. 1 and 9 are designated by the same reference numerals.

In FIG. 2, the initial circuit 11 converts a differential input signal (corresponding to the clock signals CK and /CK) into a clock signal for use in the DLL circuit. The clock signal output from the initial circuit 11 is supplied to the counter clock generation circuit 17 and the duty adjustment circuit 23.

The counter clock generation circuit 17 divides the frequency of the clock signal so as to generate and output the counter clock signal (see FIG. 5A) to the DLL cycle counter 18.

The duty detection circuit 21 performs detection as to whether the duty of the DLL clock signal is above or below 50%. Based on the duty detection result output from the duty detection circuit 21, the duty control circuit 22 performs the duty control on the update clock signal from the DLL cycle counter 18. Based on the duty signal output from the duty control circuit 22, the duty adjustment circuit 23 adjusts the duty of the clock signal output from the initial circuit 11, thus outputting the DLL clock signal.

The DLL cycle counter 18 counts the number of pulses included in the counter clock signal so as to generate the update clock signal for updating the duty control. The DLL clock detection circuit 31 detects whether or not the DLL clock signal disappears (or whether or not the DLL clock signal is placed in a clocking state), thus generating the DLL clock detection result (or the update enable/disable signals) for executing or stopping updating the duty control. The details of the DLL clock detection circuit 31 will be described later.

In FIG. 2, the initial circuit 11 converts the differential input signal (corresponding to the clock signals CK and /CK) into the clock signal, which is then supplied to the duty adjustment circuit 23. The duty adjustment circuit 23 adjusts the duty of the clock signal such that the duty of an internal clock signal (used in the DQ buffer 14) is identical to or close to 50%, thus generating and outputting the DLL clock signal to the DQ buffer 14.

The DLL clock signal output from the duty adjustment circuit 23 is supplied to the duty detection circuit 21 and subjected to duty detection. The duty detection result output from the duty detection circuit 21 is supplied to the duty control circuit 22. Based on the duty detection result, the duty control circuit 22 generates the duty signal for controlling the duty adjustment performed by the duty adjustment circuit 23. Based on the duty signal, the duty adjustment circuit 23 adjusts the duty of the clock signal output from the initial circuit 11. The details of the duty detection circuit 21 will be described later.

The DLL clock detection circuit 31 receives the DLL clock detection enable signal (from the DLL cycle counter 18) and the DLL clock signal (from the duty adjustment circuit 23), wherein the DLL clock detection circuit 31 is periodically activated by the DLL clock detection enable signal. The period of the DLL clock detection enable signal is identical to the update period for updating the duty.

The DLL clock detection circuit 31 detects either a clocking state or a non-clocking state with respect to the DLL clock signal, thus outputting the DLL clock detection result (or the update enable/disable signals) to the DLL cycle counter 18 and the duty detection circuit 21. Thus, the DLL clock detection circuit 31 controls the DLL cycle counter 18 to output or stop the update clock signal while also controlling the duty adjustment circuit 23 to execute or stop the duty control.

The second embodiment is designed such that the DLL clock detection result, which is produced by the DLL clock detection circuit 31 detecting either the clocking state or the non-clocking state with respect to the DLL clock signal, is fed back to the duty detection circuit 21 for producing the duty detection result, wherein the DLL clock signal is restored by means of the duty detection circuit 21 and the duty control circuit 22. The constitution and operation of the duty detection circuit 21 will be described later in detail.

In the delay-locked control of the DLL circuit of the second embodiment, it is possible to prevent the duty from being updated based on the duty detection result which is erroneously produced in the disappearance period of the DLL clock signal. Thus, it is possible to reduce the number of clock pulses adapted to the delay-locked control and to thereby improve the stability of the DLL circuit performing the delay-locked control. In addition, it is possible to restore the DLL clock signal by means of the duty detection circuit 21 and the duty control circuit 22.

The DLL circuit of FIG. 2 is designed such that the DLL clock detection circuit 31 is periodically activated in response to the DLL clock detection enable signal output from the DLL cycle counter 18. It can be redesigned to normally activate the DLL clock detection circuit 31.

3. Third Embodiment

Figure 3:
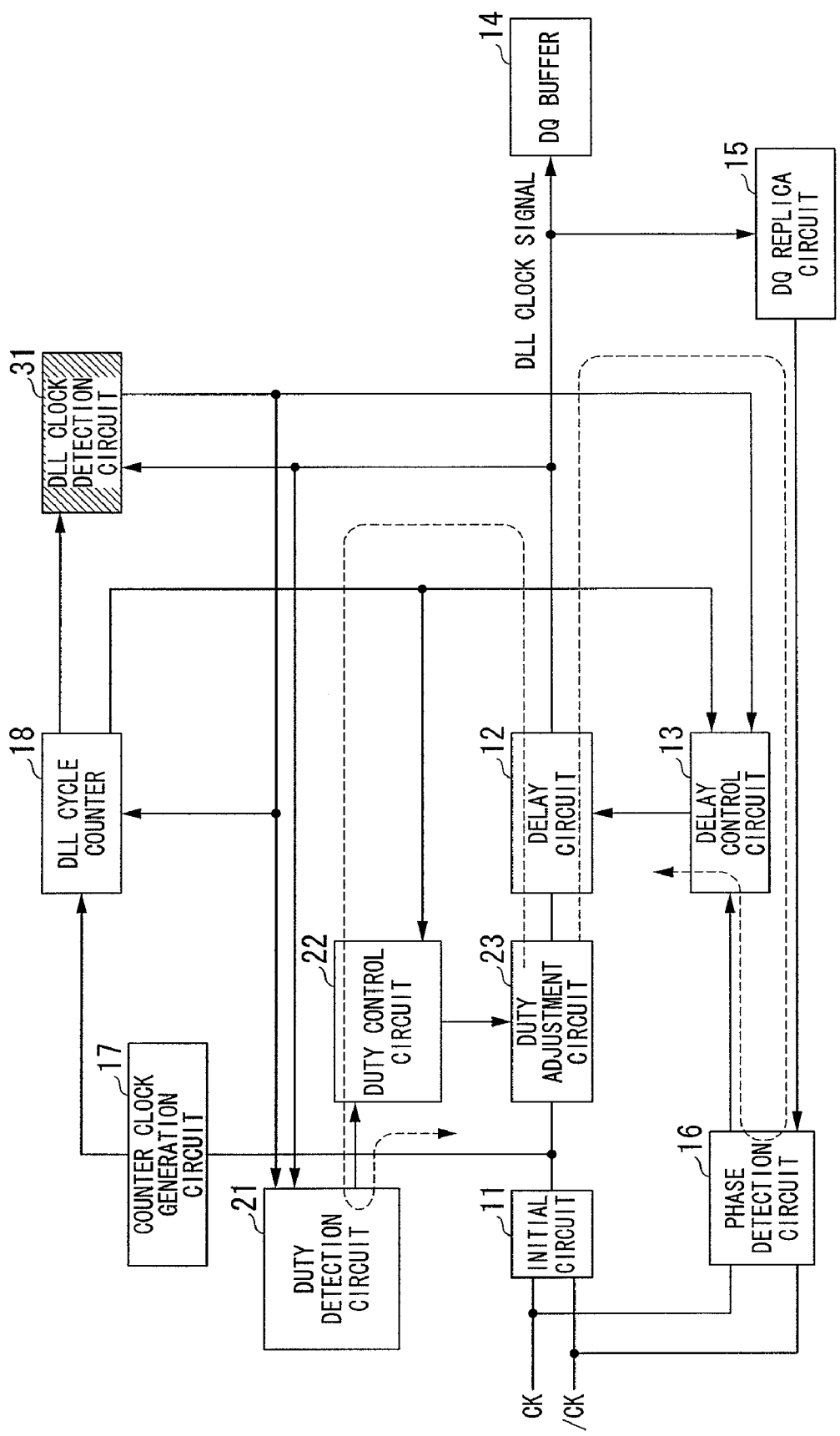
FIG. 3 is a block diagram showing the constitution of a DLL circuit according to a third embodiment of the present invention.

FIG. 3 shows a DLL circuit according to a third embodiment of the present invention, wherein parts identical to those shown in FIGS. 1, 2, and 9 are designated by the same reference numerals. The DLL circuit of FIG. 3 is designed to perform both the phase control and the duty control, wherein it is a combination of the DLL circuit of FIG. 1 achieving the phase control and the DLL circuit of FIG. 2 achieving the duty control.

The duty adjustment circuit 23 adjusts the duty of the clock signal of the initial circuit 11 such that the duty of an internal clock signal used in the DQ buffer 14 becomes equal to or close to 50%. The delay circuit 12 corrects the delay time imparted to the duty-adjusted clock signal output from the duty adjustment circuit 23 such that the DQ output signal of the DQ buffer 14 is synchronized with the clock signals CK and /CK, thus outputting the DLL clock signal to the DQ buffer 14.

The DLL clock signal is supplied to the DQ replica circuit 15 having the same PVT dependency as the DQ buffer 14. Since the DQ replica circuit 15 serves as a buffer circuit having the same dependency of process, voltage, and temperature as the DQ buffer 14, the DQ replica output signal is output at the same timing as the DQ output signal. The DQ replica output signal of the DQ replica circuit 15 is supplied to the phase detection circuit 16 and subjected to phase comparison with the clock signals CK and /CK. The phase detection result output from the phase detection circuit 16 is supplied to the delay control circuit 13, thus adjusting the delay time by way of the delay circuit 12.

The DDL clock signal is supplied to the duty detection circuit 21 and subjected to duty detection, so that the duty detection result is supplied to the duty control circuit 22, thus adjusting the duty by way of the duty adjustment circuit 23.

The DLL clock detection circuit 31 is periodically activated by the DLL clock detection enable signal, wherein the period of the DLL clock detection enable signal is identical to the period for updating the delay time and duty.

The DLL clock detection circuit 31 detects either the clocking state or the non-clocking state with respect to the DLL clock signal, thus generating the DLL clock detection result (or the update enable/disable signals). The DLL clock detection result is supplied to the delay control circuit 13, the DLL cycle counter 18, and the duty detection circuit 21.

In accordance with the DLL clock detection result, the DLL cycle counter 18 outputs or stops the update clock signal while the delay control circuit 13 executes or stops updating the delay time. In addition, the duty detection circuit 21, the duty control circuit 22, and the duty adjustment circuit 23 collaborate to execute or stop updating the duty in accordance with the DLL clock detection result.

The third embodiment is designed such that the DLL clock detection circuit 31 detects either the clocking state or the non-clocking state with respect to the DLL clock signal, and then the DLL clock detection result is supplied to the delay control circuit 13, the DLL cycle counter 18, and the duty control circuit 22, thus inhibiting the delay control and the duty control in the non-clocking state of the DLL clock signal.

In addition, the third embodiment is designed such that the DLL clock detection result, which is produced by the DLL clock detection circuit 31 detecting either the clocking state or the non-clocking state with respect to the DLL clock signal, is fed back to the duty detection circuit 21 producing the duty detection result, wherein the DLL clock signal is restored by way of the duty detection circuit 21 and the duty control circuit 22. The constitution and operation of the duty detection circuit 21 will be described later in detail.

In the delay-locked control of the DLL circuit of the third embodiment, it is possible to prevent the delay time and the duty from being updated based on the phase detection result and the duty detection result which are erroneously produced in the disappearance period of the DLL clock signal. Thus, it is possible to reduce the number of clock pulses adapted to the delay-locked control and to thereby improve the stability of the DLL circuit performing the delay-locked control. In addition, it is possible to restore the DLL clock signal by means of the duty detection circuit 21 and the duty control circuit 22.

The DLL circuit of FIG. 3 is designed such that the DLL clock detection circuit 31 is periodically activated in response to the DLL clock detection enable signal output from the DLL cycle counter 18. It can be redesigned to normally activate the DLL clock detection circuit 31.

Figure 4:
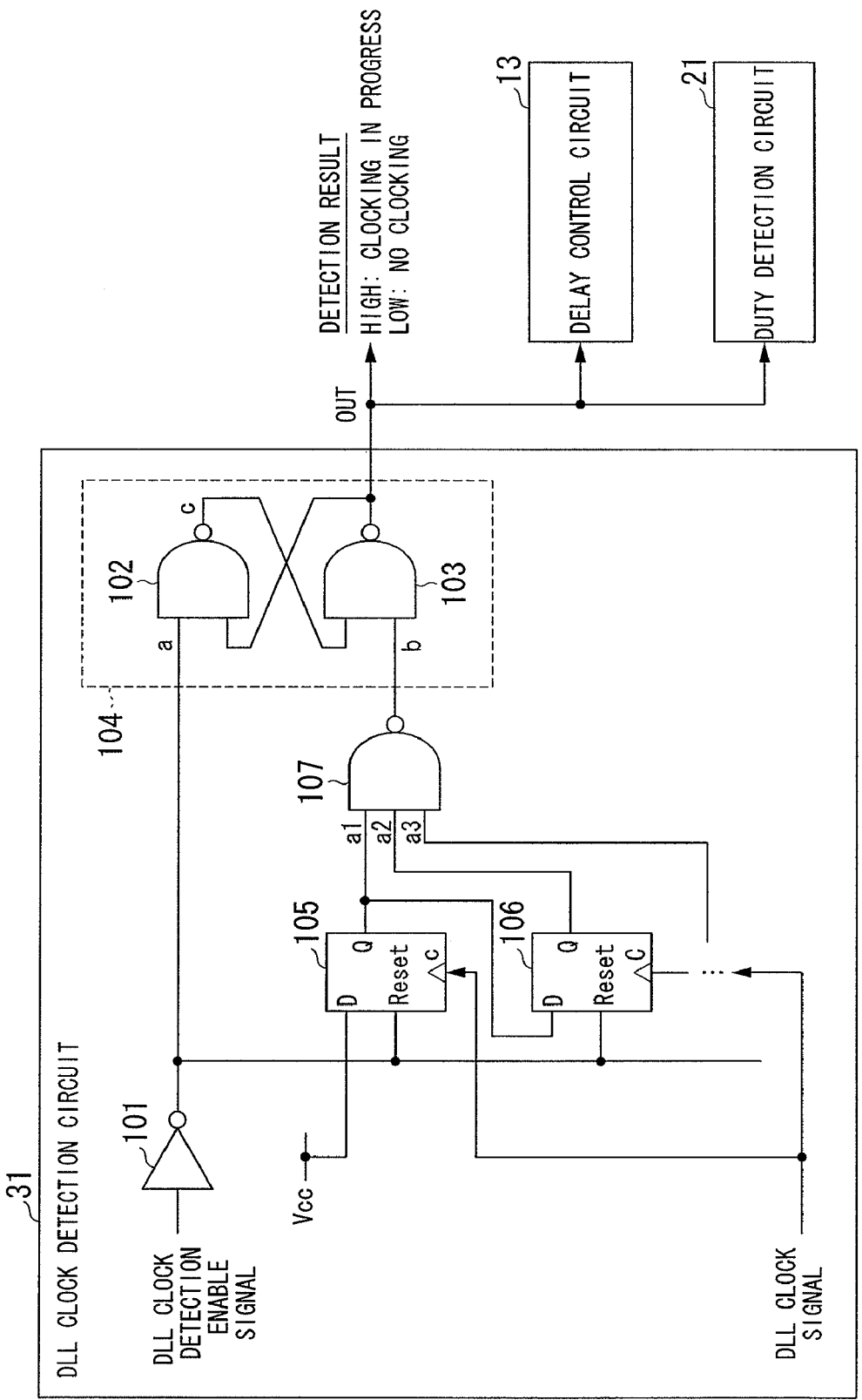
FIG. 4 is a block diagram showing the constitution of a DLL clock detection circuit shown in FIGS. 1 to 3.

FIG. 4 shows the detailed constitution of the DLL clock detection circuit 31. The DLL clock detection enable signal from the DLL cycle counter 18 is supplied to an inverter 101 of the DLL clock detection circuit 31.

The output signal of the inverter 101 is supplied to reset terminals R of D-type latch circuits 105 and 106 (having data terminals D, output terminals Q, and clock terminals C) as well as a first input terminal "a" of an RS-type latch circuit 104 including NAND circuits 102 and 103. In the RS-type latch circuit 104, the first input terminal "a" corresponds to one input terminal of the NAND circuit 102, and a second input terminal "b" corresponds to one input terminal of the NAND circuit 103, wherein the NAND circuits 102 and 103 are coupled together such that an output terminal "c" of the NAND circuit 102 is connected to another input terminal of the NAND circuit 103 whose output terminal is connected to another input terminal of the NAND circuit 102.

The DLL clock detection circuit 31 includes a plurality of D-type latch circuits wherein the D-type latch circuit 105 is an uppermost one and is followed by the D-type latch circuit 106. The date terminal D of the first D-type latch circuit 105 is connected to a power-supply voltage Vcc (at a high level) while an output terminal Q thereof is connected to the data terminal D of the second D-type latch circuit 106.

The D-type latch circuits 105 and 106 are followed by a NAND circuit 107 having three input terminals a1, a2, and a3 such that the output terminal Q of the first D-type latch circuit 105 is connected to the first input terminal a1 while the output terminal Q of the second D-type latch circuit 106 is connected to the second input terminal a2. Both the clock terminals C of the D-type latch circuits 105 and 106 receive the DLL clock signal subjected to detection.

FIG. 4 shows the two D-type latch circuits 105 and 106, whereas it is possible to incorporate three or more D-type latch circuits; hence, the output terminal Q of the third D-type latch circuit (not shown) is connected to the third input terminal a2 of the NAND circuit 107, wherein the data terminal D thereof is connected to the output terminal Q of the second D-type latch circuit 106. Similarly, fourth and other D-type latch circuits can be incorporated into the DLL clock detection circuit 31.

The output signal of the NAND circuit 107 is supplied to the second input terminal b of the RS-type latch circuit 104, so that the RS-type latch circuit 104 outputs an output signal OUT as the DLL clock detection result (or the update enable/disable signals) toward the delay control circuit 13 and the duty detection circuit 21. The DLL clock detection result becomes a high-level update enable signal in the clocking state of the DLL clock signal, while it becomes a low-level update disable signal in the non-clocking state of the DLL clock signal.

The DLL clock detection enable signal becomes high so as to activate the DLL clock detection circuit 31, wherein a low-level output signal of the inverter 101 is supplied to the reset terminals R of the D-type latch circuits 105 and 106 so as to release the reset states of the D-type latch circuits 105 and 106, so that the output terminals Q of the D-type latch circuits 105 and 106 are each turned to a low level.

Just after the reset states of the D-type latch circuits 105 and 106 are released, the input terminals a1 and a2 of the NAND circuit 107 are each set at a low level, so that the output signal of the NAND circuit 107 is at a high level which is applied to the second input terminal b of the RS-type latch circuit 104. Since the low-level output signal of the inverter 101 is supplied to the first input terminal a1 (corresponding to one input terminal of the NAND circuit 102), the output terminal c of the NAND circuit 102 becomes high, so that the output signal OUT (corresponding to the output terminal of the NAND circuit 103) becomes low. That is, just after the DLL clock detection circuit 31 is activated, the RS-type latch circuit 104 outputs the low-level output signal OUT serving as the update disable signal declaring the non-clocking state of the DLL clock signal.

At the leading edge of a first pulse of the DLL clock signal supplied to the clock terminals C of the D-type latch circuits 105 and 106, the output terminal Q of the D-type latch circuit 105 becomes high while the output terminal Q of the D-type latch circuit 106 remains low.

When a second pulse of the DLL clock signal is subsequently supplied to the clock terminals C of the D-type latch circuits 105 and 106, the output terminal Q of the D-type latch circuit 106 becomes high while the output terminal Q of the D-type latch circuit 105 remains high. That is, every time the D-type latch circuits receive a pulse of the DLL clock signal, the output terminals Q thereof are sequentially turned to a high level in an order from the uppermost one.

When all the output terminals Q of the D-type latch circuits (including the D-type latch circuits 105 and 106) become high, all the input terminals of the NAND circuit 107 become high so that the NAND circuit 107 outputs a low-level signal to the second input terminal b of the RS-type latch circuit 104 (corresponding to one input terminal of the NAND circuit 103). Thus, the output terminal of the NAND circuit 103 becomes high so that the output signal OUT of the RS-type latch circuit 104 correspondingly becomes high, whereby the DLL clock detection circuit 31 outputs the update enable signal declaring the clocking state of the DLL clock signal.

When the DLL clock signal disappears, at least one of the input terminals a1 to a3 of the NAND circuit 107 remains at a low level so that the output terminal of the NAND circuit 107 still remains at a high level, wherein the output signal OUT of the RS-type latch circuit 104 is not turned to a high level and still remains at a low level, so that the DLL clock detection circuit 31 outputs the update disable signal declaring the non-clocking state of the DLL clock signal.

Thereafter, the DLL clock detection enable signal becomes low, so that the RS-type latch circuit 104 retains the previous DLL clock detection result (representing either the clocking state or the non-clocking state) until DLL clock detection enable signal turns to a high level.

The activation period (or high-level period) of the DLL clock detection enable signal is set to "2×(clock period tCK [ns])" or more when the DLL clock detection circuit 31 uses the two D-type latch circuits 105 and 106. In response to the number "n" of D-type latch circuits included in the DLL clock detection circuit 31 (where n≧3), the activation period of the DLL clock detection enable signal is set to "n×(clock period tCK [ns])" or more.

Next, the operation of the DLL clock detection circuit 31 of FIG. 4 will be described with reference to time charts of FIGS. 5A to 5F.

FIG. 5A shows the counter clock signal, which is generated by the counter clock generation circuit 17 based on the clock signal of the initial circuit 11 and supplied to the DLL cycle counter 18.

FIG. 5B shows the DLL clock detection enable signal including pulses C1 and C2, which is generated by the DLL cycle counter 18 and is supplied to the DLL clock detection circuit 31.

FIG. 5C shows a fractional clock signal including pulses B1 and B2, the frequency of which is a fraction of the frequency of the counter clock signal subjected to frequency dividing in the DLL cycle counter 18. FIG. 5D shows the DLL clock signal output from the delay circuit 12.

FIG. 5E shows the DLL clock detection result produced by the DLL clock detection circuit 31, wherein the DLL clock detection result becomes high to serve as the update enable signal or becomes low to serve as the update disable signal. FIG. 5F shows the update clock signal including a pulse K1 output from the DLL cycle counter 18.

Next, the operation of the DLL clock detection circuit 31 for detecting either the clocking state or the non-clocking state and the operation of the DLL cycle counter 18 for generating the update clock signal will be described with reference to FIGS. 5A to 5F.

Upon reception of the counter clock signal of FIG. 5A, the DLL cycle counter 18 counts the number of pulses included in the counter clock signal so as to generate and output the DLL clock detection enable signal of FIG. 5B including the pulses C1 and C2, each of which occurs in each update period T, to the DLL clock detection circuit 31. The DLL cycle counter 18 also generates a fractional clock signal of FIG. 5C including the pulses B1 and B2, each of which occurs in each update period T. The update clock signal of FIG. 5F is generated based on the fractional clock signal of FIG. 5C including the pulses B1 and B2.

The DLL clock detection circuit 31 starts detecting either the clocking state or the non-clocking state with respect to the DLL clock signal of FIG. 5E in response to the pulse C1 shown in FIG. 5B. Since the clocking state of the DLL clock signal of FIG. 5D occurs in the high-level period of the pulse C1, the DLL clock detection result becomes high so that the DLL cycle counter 18 generates the pulse K1 of the update clock signal of FIG. 5F. In response to the pulse K1, the delay circuit 12 and the delay control circuit 13 starts updating the delay time, while the duty control circuit 22 and the duty adjustment circuit 23 starts updating the duty.

Due to the non-clocking state of the DLL clock signal occurring at the timing when the DLL clock detection circuit 31 starts detecting either the clocking state or the non-clocking state of the DLL clock signal in response to the pulse C2 of the DLL clock detection enable signal of FIG. 5B, the DLL clock signal is stacked to a low level so that the DLL clock detection result of FIG. 5E becomes low, wherein the DLL cycle counter 18 stops generating a pulse of the update clock signal of FIG. 5F. In the non-clocking state of the DLL clock signal, the delay circuit 12 and the delay control circuit 13 stop updating the delay time, while the duty control circuit 22 and the duty adjustment circuit 23 stop updating the duty.

FIGS. 6A to 6J show waveforms of signals based on simulation of the DLL clock detection circuit 31. Specifically, FIGS. 6A to 6E show the waveforms of signals in the clocking state of the DLL clock signal, while FIGS. 6F to 6J show the waveforms of signals which are temporarily varied due to disappearance of pulses in the DLL clock signal.

The waveforms of signals shown in FIGS. 6A to 6J are drafted in connection with the DLL clock detection circuit 31 of FIG. 4 including the two D-type latch circuits 105 and 106, wherein a high-level period of a pulse of the DLL clock detection enable signal corresponds to two cycles of pulses of the DLL clock signal.

First, the operation of the DLL circuit in the clocking state of the DLL clock signal will be described with reference to FIGS. 6A to 6E, wherein the DLL clock detection enable signal of FIG. 6A becomes high at time t1 so as to activate the DLL clock detection circuit 31.

The DLL clock detection result of FIG. 6C becomes high time t2 in synchronization with the leading edge of a pulse C1 which is a second pulse of the DLL clock signal of FIG. 6B counted after time t1 when the DLL clock detection enable signal of FIG. 6A becomes high. At time t3, the update enable/disable signal of FIG. 6D becomes high (declaring the update enable state) and is supplied to the delay control circuit 13, the DLL cycle counter 18, and the duty detection circuit 21.

Thus, the update clock signal of FIG. 6E becomes high at time t4 so as to activate the delay control circuit 13 and the duty control circuit 22.

In response to the high-level update clock signal from the DLL cycle counter 18 and the high-level update enable/disable signal from the DLL clock detection circuit 31, the delay control circuit 13 controls the delay circuit 12 to adjust the delay time applied to the DLL clock signal.

On the other hand, in response to the high-level update clock signal from the DLL cycle counter 18 and the duty detection result from the duty detection circuit 21, the duty control circuit 22 controls the duty adjustment circuit 23 to adjust the duty of the DLL clock signal, which is thus set to 50%.

Next, the operation of the DLL circuit coping with the disappearance of pulses of the DLL clock signal will be described with reference to FIGS. 6F to 6J, wherein the DLL clock signal of FIG. 6G is normally placed in the clocking state before time t1 so that both the DLL clock detection result of FIG. 6H and the update enable/disable signal of FIG. 6I are at a high level.

At time t1 when the DLL clock detection enable signal of FIG. 6F becomes high, the DLL clock detection circuit 31 starts detecting either the clocking state or the non-clocking state of the DLL clock signal.

At time t1, pulses disappear in the DLL clock signal of FIG. 6G, which is stacked to a high level.

Thus, the DLL clock detection result of FIG. 6H becomes low at time t1, and then the update enable/disable signal of FIG. 6I becomes low (declaring the update disable state) at time t3. That is, the update disable signal is supplied to the delay control circuit 13, the DLL cycle counter 18, and the duty detection circuit 21.

Thus, the DLL cycle counter 18 does not generate a pulse of the update clock signal shown in FIG. 6J, thus stopping updating the delay control circuit 13 and the duty detection circuit 21. Therefore, the duty detection circuit 21 and the duty control circuit 22 stop updating the duty of the DLL clock signal, while the delay circuit 12 and the delay control circuit 13 stop updating the delay time applied to the DLL clock signal. For this reason, the previous duty and the previous delay time are maintained with respect to the DLL clock signal.

Figure 7:
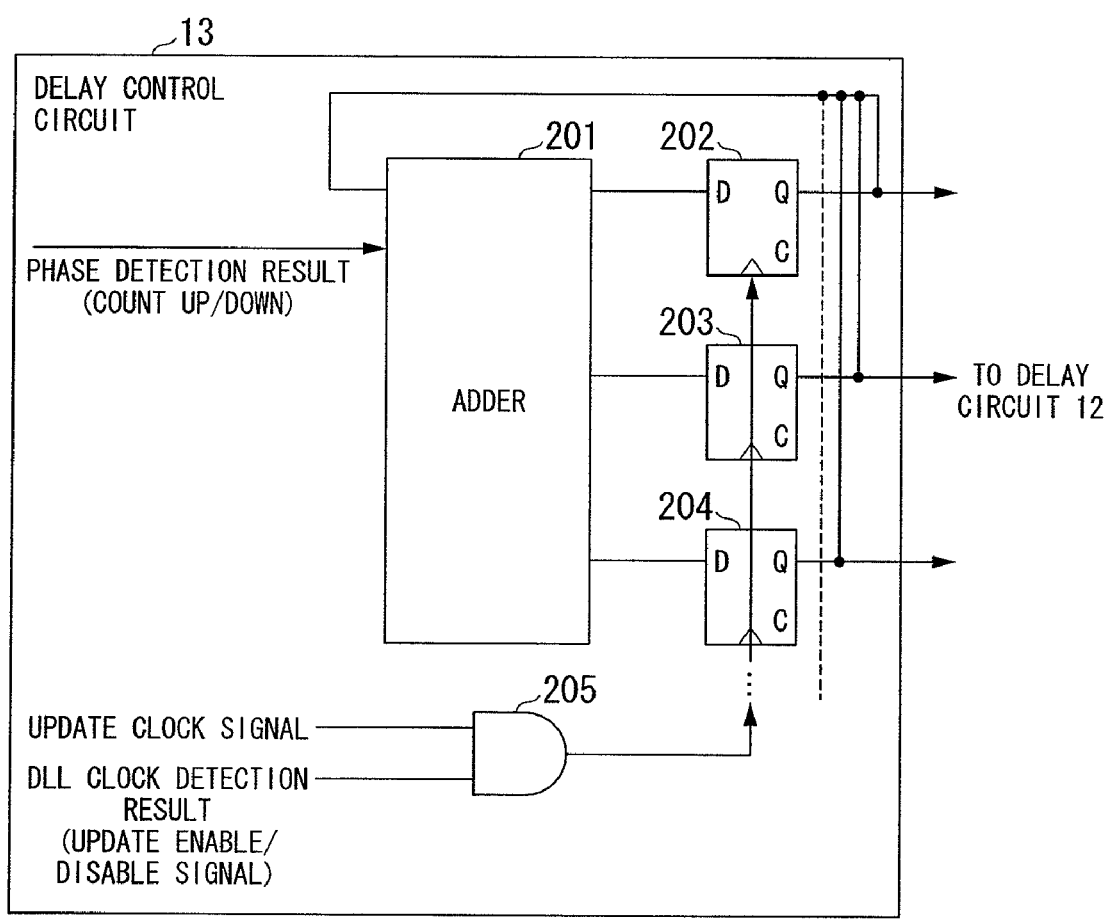
FIG. 7 is a circuit diagram showing the constitution of a delay control circuit shown in FIGS. 1 and 3.

FIG. 7 shows the detailed constitution of the delay control circuit 13, which is designed to determine the delay time of the delay circuit 12 based on the phase detection result produced by the phase detection circuit 16.

As shown in FIG. 7, the delay control circuit 13 is constituted of an adder 201, D-type latch circuits 202, 203, and 204 (having data terminals D, output terminals Q, and clock terminals C), and an AND circuit 205. All the output terminals Q of the D-type latch circuits 202, 203, and 204 are connected to the adder 201, which also receives the phase detection result (representing a count-up signal UP and a count-down signal DOWN) output from the phase detection circuit 16. The adder 201 outputs three output signals to the date terminals D of the D-type latch circuits 202, 203, and 204 respectively.

A first input terminal of the AND circuit 205 receives the update clock signal from the DLL cycle counter 18, while a second input terminal thereof receives the DLL clock detection result (i.e. the update enable/disable signals) from the DLL clock detection circuit 31. The output terminal of the AND circuit 205 is connected to the clock terminals C of the D-type latch circuits 202, 203, and 204 respectively.

In the delay control circuit 13 of FIG. 7, the D-type latch circuits 202, 203, and 204 latch respective delay times, which are supplied to the adder 201. Upon reception the phase detection signal (representing either the counter-up signal UP or the count-down signal DOWN), the adder 201 update the present delay time by increasing or decreasing.

When the DLL clock detection result becomes high (denoting the update enable signal) during the high-level period of the update clock signal, the output signal of the adder 201 (representing the updated delay time) is latched by the D-type latch circuits 202 to 204, from which it is supplied to the delay circuit 12.

When the DLL clock detection result becomes low (denoting the update disable signal) during the high-level period of the update clock signal, the output signal of the AND circuit 205 becomes low so that the updated delay time of the adder 201 is not latched by the D-type latch circuits 202 to 204. At this time, the D-type latch circuits 202 to 204 are not updated so as to still retain the previous delay time.

FIG. 7 shows the three D-type latch circuits 202 to 204, whereas the number of D-type latch circuits included in the delay control circuit 13 can be increased to four or more as necessary.

Next, the detailed constitution and operation of the duty detection circuit 21 will be described with reference to FIGS. 8A to 8C. The duty detection circuit 21 is designed to detect the duty of the DLL clock signal compared to the reference duty ratio of 50%.

Figures 8A, 8B, 8C:
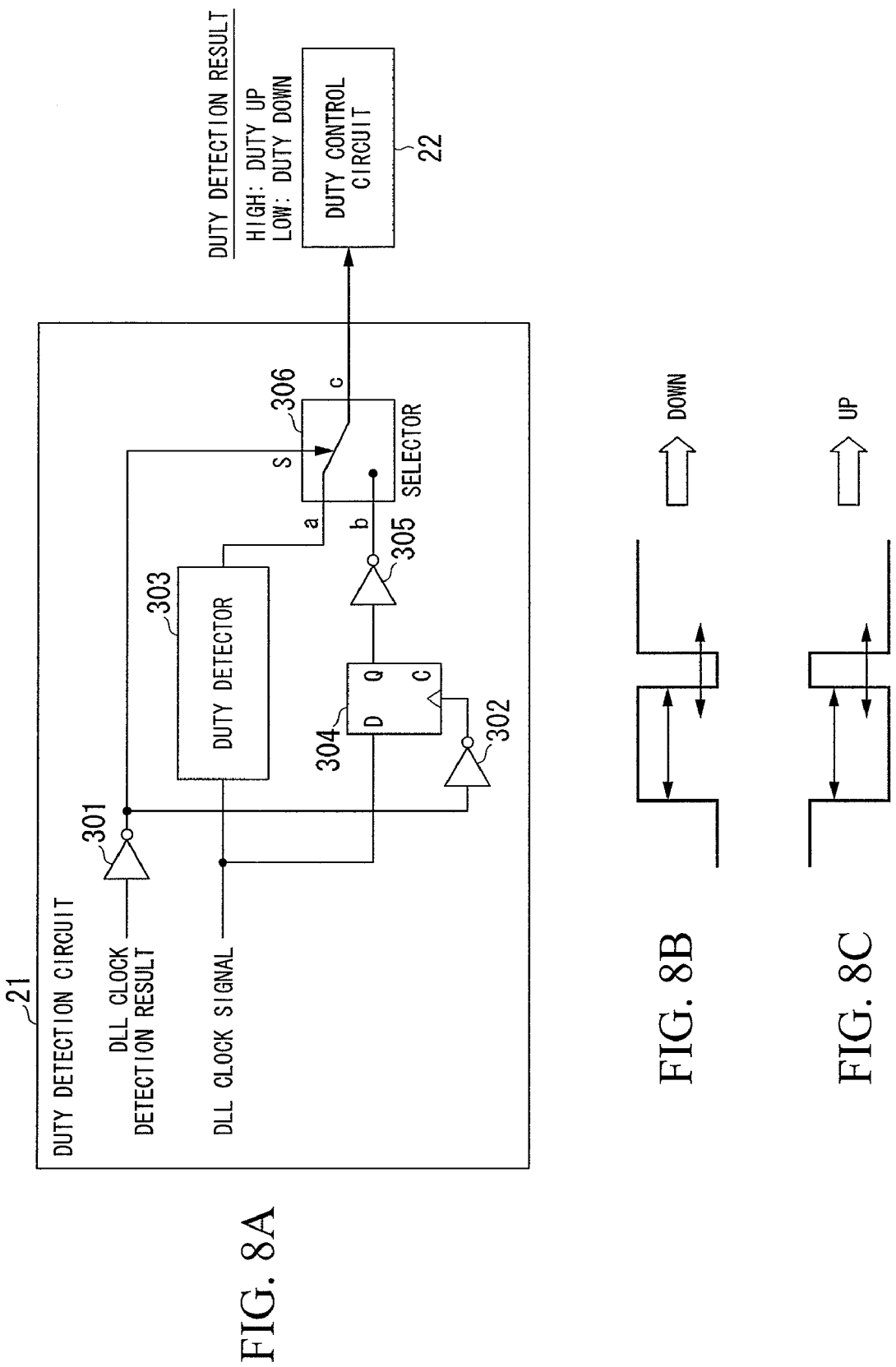
FIG. 8A is a circuit diagram showing the constitution of a duty detection circuit shown in FIGS. 2 and 3.
FIG. 8B shows a part of the waveform of the DLL clock signal whose duty is greater than 50%.
FIG. 8C shows a part of the waveform of the DLL clock signal whose duty is less than 50%.

In the duty detection circuit 21 of FIG. 8A, an inverter 301 receives the DLL clock detection result (i.e. the update enable/disable signals) from the DLL clock detection circuit 31 so as to provide an output signal thereof to an inverter 302 and an ON/OFF control terminal S of a selector 306.

Meanwhile, the DLL clock signal is supplied to a duty detector 303 and a data terminal D of a D-type latch circuit 304. The output signal of the duty detector 303 is supplied to a first input terminal "a" of the selector 306. The output signal of the D-type latch circuit 304 at its output terminal Q is inverted in logic level by an inverter 305 and is then supplied to a second input terminal "b" of the selector 306.

The duty detector 303 detects whether the duty (i.e. the high-level period of a pulse of the DLL clock signal) is greater or less than 50%, thus producing the duty detection result. In the case of FIG. 8B in which the duty is greater than 50%, the duty detector 303 outputs a duty decrease signal (i.e. a low-level signal) to the first input terminal "a" of the selector 306. In the case of FIG. 8C in which the duty is less than 50%, the duty detector 303 outputs a duty increase signal (i.e. a high-level signal) to the first input terminal "a" of the selector 306.

In response to the high-level DLL clock detection result (declaring the clocking state of the DLL clock signal), the selector 306 switches over to the first input terminal "a" so as to select the duty detection result of the duty detector 303, which is then output to the duty control circuit 22.

In response to the low-level DLL clock detection result (declaring the non-clocking state of the DLL clock signal), the selector 306 switches over to the second input terminal "b" so as to select the output signal of the inverter 305, which is then output to the duty control circuit 22.

In the transition of the DLL clock detection result to the low level, the D-type latch circuit 304 latches the stack level of the DLL clock signal, which is inverted by the inverter 305 (whose input terminal is connected to the output terminal Q of the D-type latch circuit 304) and is then supplied to the second input terminal b of the selector 306.

When the DLL clock detection result declares the non-clocking state of the DLL clock signal, the duty detection result turns to a low level (representing the duty decrease signal) in response to the "high" level stacked in the DLL clock signal, while the duty detection result turns to a high level (representing the duty increase signal) in response to the "low" level stacked in the DLL clock signal. Responding to the high level or the low level of the duty detection result, the duty of the DLL clock signal is restored by increasing or decreasing. This makes it possible to control the duty of the DLL clock signal, thus restoring the clocking state of the DLL clock signal.

Lastly, it is apparent that the present invention is not limited to the above embodiments, but may be modified and changed without departing from the scope and spirit of the invention.

What is claimed is:

1. A DLL circuit adjusting a duty of an input clock signal, comprising:
   a duty control circuit that produces a duty signal to control the duty of the input clock signal;
   a duty adjustment circuit that adjusts the duty of the input clock signal based on the duty signal, thus producing a DLL clock signal; and
   a DLL clock detection circuit that detects either a clocking state or a non-clocking state with respect to the DLL clock signal,
   wherein the DLL clock detection circuit controls the duty control circuit to produce the duty signal to change the DLL clock signal from the non-clocking state to the clocking state when the DLL clock detection circuit detects the non-clocking state with respect to the DLL clock signal.

2. A DLL circuit comprising:
   a duty control circuit that produces a duty signal to control a duty of a first clock signal input thereto;
   a duty adjustment circuit that adjusts the duty of the first clock signal based on the duty signal, thus producing a second clock signal;
   a delay control circuit that produces a delay signal to control a delay time applied to the second clock signal;
   a delay circuit that applies the delay time to the second clock signal based on the delay signal, thus producing a DLL clock signal; and
   a DLL clock detection circuit that detects either a clocking state or a non-clocking state with respect to the DLL clock signal,
   wherein the DLL clock detection circuit controls at least one of the duty control circuit and the delay control to produce corresponding one or ones of the duty signal and the delay signal to change the DLL clock signal from the non-clocking state to the clocking state when the DLL clock detection circuit detects the non-clocking state of the DLL clock signal.

3. A DLL circuit adjusting a phase of an input clock signal, comprising:
   a delay control circuit that produces a delay signal to control a delay time applied to the input clock signal;
   a delay circuit that applies the delay time to the input clock signal based on the delay signal, thus producing a DLL clock signal; and
   a DLL clock detection circuit that detects either a clocking state or a non-clocking state with respect to the DLL clock signal,
   wherein the DLL clock detection circuit controls the delay control circuit to produce the delay signal to change the DLL clock signal from the non-clocking state to the clocking state when the DLL clock detection circuit detects the non-clocking state with respect to the DLL clock signal, and
   wherein the DLL clock signal and a DLL clock detection enable signal for periodically activating the DLL clock detection circuit are supplied to the DLL clock detection circuit, which includes a counter for counting a number of pulses included in the DLL clock signal during activation of the DLL clock detection enable signal, and a latch circuit for declaring the clocking state of the DLL clock signal when the counted number is greater than a prescribed number and for declaring the non-clocking state of the DLL clock signal when the counted number is less than the prescribed number.

4. The DLL circuit according to claim 1, wherein the DLL clock signal and a DLL clock detection enable signal for periodically activating the DLL clock detection circuit are supplied to the DLL clock detection circuit, which includes a counter for counting a number of pulses included in the DLL clock signal during activation of the DLL clock detection enable signal, and a latch circuit for declaring the clocking state of the DLL clock signal when the counted number is greater than a prescribed number and for declaring the non-clocking state of the DLL clock signal when the counted number is less than the prescribed number.

5. A DLL circuit adjusting a phase of an input clock signal, comprising:
   a delay control circuit that produces a delay signal to control a delay time applied to the input clock signal;
   a delay circuit that applies the delay time to the input clock signal based on the delay signal, thus producing a DLL clock signal;
   a DLL clock detection circuit that detects either a clocking state or a non-clocking state with respect to the DLL clock signal;
   a DQ buffer for buffering the DLL clock signal;
   a DQ replica circuit for receiving the DLL clock signal so as to output a DQ replica output signal; and
   a phase detection circuit for detecting a phase difference between the input clock signal and the DQ replica output signal, thus producing a phase detection result,
   wherein the DLL clock detection circuit controls the delay control circuit to produce the delay signal to change the DLL clock signal from the non-clocking state to the clocking state when the DLL clock detection circuit detects the non-clocking state with respect to the DLL clock signal,
   wherein the delay control circuit includes a latch circuit for latching the delay time presently applied to the DLL clock signal, and an adder for adding the phase difference to the delay time based on the phase detection result so as to produce an addition result, and
   wherein the addition result of the adder is latched by the latch circuit as a new delay time when the DLL clock detection circuit declares the clocking state of the DLL clock signal.

6. The DLL circuit according to claim 1 further comprising a duty detection circuit including a duty detector for detecting the duty of the DLL clock signal, a latch circuit for latching a stacked level of the DLL clock signal, and a selector for selecting an output signal of the duty detector when the DLL clock detection circuit declares the non-clocking state of the DLL clock signal and for selecting the stacked level or its inverted level when the DLL clock detection circuit declares the non-clocking state of the DLL clock signal.

7. A semiconductor device including the DLL circuit according to claim 1.

8. A semiconductor device comprising:
   a control circuit that responds to first and second feedback signals to produce a control signal; and
   a DLL clock signal generation circuit that receives an input clock signal and the control signal and generates a DLL clock signal that is related to the input clock signal and controlled in at least one of a phase and a duty in response to the control signal,
   wherein the first feedback signal is produced in response to at least the DLL clock signal and the second feedback signal that is produced in response to the DLL clock signal unchanged in a logic level during at least one cycle of the input clock signal.

9. The semiconductor device according to claim 8, wherein the DLL clock signal generation circuit comprises a duty adjustment circuit, and wherein the control circuit comprises a duty control circuit that is coupled to receive the first and second feedback signals and supplies the control signal to the duty adjustment circuit to adjust a duty of the DLL clock signal.

10. The semiconductor device according to claim 9, wherein the DLL clock signal generation circuit further comprises a delay circuit coupled in series with the duty adjustment circuit, wherein the control circuit further comprises a delay control circuit that produces an additional control signal in response to the first and second feedback signals, and wherein the additional control signal is supplied to the delay circuit to delay the DLL clock signal with respect to the input clock signal.

11. The semiconductor device according to claim 10, wherein the first feedback signal is produced in response to the input clock signal.

12. the semiconductor device according to claim 8, wherein the DLL clock signal generation circuit comprises a delay circuit, wherein the control circuit comprises a delay control circuit, wherein the first feedback signal is produced in response to the input clock signal and the DLL clock signal, and wherein the delay control circuit is coupled to receive the first and second feedback signals and supplies the control signal to the delay circuit to delay the DLL clock signal with respect to the input clock signal.

13. The semiconductor device according to claim 12, wherein the DLL clock signal generation circuit further comprises a duty adjustment circuit coupled in series with the delay circuit, wherein the control circuit further comprises a duty control circuit that produces an additional control signal in response to the DLL clock signal and the second feedback signal, and wherein the additional control signal is supplied to the duty adjustment circuit to control a duty of the DLL clock signal.

* * * * *